United States Patent
Glimtoft et al.

(10) Patent No.: US 12,055,858 B2
(45) Date of Patent: Aug. 6, 2024

(54) METHOD AND DEVICE FOR PATTERN GENERATION

(71) Applicant: Mycronic AB, Taby (SE)

(72) Inventors: Martin Glimtoft, Alvsjo (SE); Jan Sterner, Sollentuna (SE); Robert Eklund, Stockholm (SE); Fredric Ihren, Taby (SE); Pontus Stenstrom, Akersberga (SE)

(73) Assignee: Mycronic AB, Taby (SE)

( * ) Notice: Subject to any disclaimer, the term of this patent is extended or adjusted under 35 U.S.C. 154(b) by 0 days.

(21) Appl. No.: 17/997,846

(22) PCT Filed: Jun. 14, 2021

(86) PCT No.: PCT/EP2021/065930
§ 371 (c)(1),
(2) Date: Nov. 3, 2022

(87) PCT Pub. No.: WO2021/254948
PCT Pub. Date: Dec. 23, 2021

(65) Prior Publication Data
US 2023/0152711 A1 May 18, 2023

(30) Foreign Application Priority Data
Jun. 17, 2020 (EP) .................... 20180444

(51) Int. Cl.
*G03F 7/00* (2006.01)
(52) U.S. Cl.
CPC .......... *G03F 7/704* (2013.01); *G03F 7/70508* (2013.01)
(58) Field of Classification Search
CPC .. G03F 7/70258; G03F 7/70291; G03F 7/704; G03F 7/70433; G03F 7/70508
See application file for complete search history.

(56) References Cited

U.S. PATENT DOCUMENTS

| | | |
|---|---|---|
| 2004/0223229 A1 | 11/2004 | Ishikawa |
| 2005/0018997 A1 | 1/2005 | Bleeker |
| | (Continued) | |

FOREIGN PATENT DOCUMENTS

JP    2011039415 A  *  2/2011

OTHER PUBLICATIONS

International Search Report PCT/ISA/210 and Written Opinion PCT/ISA/237 for International Application No. PCT/EP2021/065930 dated Sep. 13, 2021.

(Continued)

*Primary Examiner* — Peter B Kim
(74) *Attorney, Agent, or Firm* — Harness, Dickey & Pierce, P.L.C.

(57) ABSTRACT

A rasterization method of patterns with periodic components for SLMs is presented, comprising obtaining (S10) of an original pattern, having a periodicity. A first pattern main period is determined (S21). Image area and a first pitch of imaged elements are obtained (S31). The original pattern is scaled (S41) by a first raster scaling factor. The scaled pattern is cropped (S51) to comprise a first integer number of repetitions of the pattern items presenting a periodicity in the first direction that is covered by the image area, giving a rasterized pattern adapted to the intended pattern generator. The rasterized pattern is associated with data representing the first scaling factor. A writing method comprises obtaining of the rasterized pattern. Elements of the SLM in the pattern generator falling outside the rasterized pattern are set to be disabled. The rasterized pattern is written with an optical scaling to a target surface.

20 Claims, 12 Drawing Sheets

(56) References Cited

U.S. PATENT DOCUMENTS

2005/0219502 A1 10/2005 Sandstrom et al.
2009/0199152 A1 8/2009 Sjostrom

OTHER PUBLICATIONS

European Search Report dated Dec. 20, 2021.

* cited by examiner

METHOD AND DEVICE FOR PATTERN GENERATION

CROSS-REFERENCE TO RELATED APPLICATIONS

This application is a national phase under 35 U.S.C. § 371 of PCT International Application No. PCT/EP2021/065930 which has an International filing date of Jun. 14, 2021, which claims priority to EP Application No. 20180444.0, filed Jun. 17, 2020, the entire contents of each of which are hereby incorporated by reference.

TECHNICAL FIELD

The present invention relates in general to rasterization and writing of patterns with spatial light modulator pattern generators and in particular to methods and devices for rasterization and writing of patterns with periodic components.

BACKGROUND

Pattern generators are today used for many types of purposes. Pattern generators used in lithography systems or photomask lithography systems are required to present very accurate printing properties. One approach to obtain high-quality pattern printing is to use Spatial Light Modulators (SLM), e.g. Digital Micromirror Devices (DMD), Liquid Crystal Displays (LCD), Grating Light Valves (GLV), Planar Light Valves (PLV), Micro Shutter Arrays (MSA), Analogue Spatial Light Modulators (ASLM) and/or Liquid Crystal on Silicon (LCS). The SLM has an array of individually controllable elements arranged for generating an array of imaged elements within an image area on a target surface. The illumination of each individual imaged element is controlled by a respective such element.

The SLM has an inherent periodicity and in applications where also the pattern that is going to be printed also presents a periodicity, different kinds of interference effects may arise. Such effects may remain in the final product, such as different types of screens, perceptible for the human vision. Very small variations can more easily be observed if they are systematical and are then often referred to as Mura effects. An SLM used in a pattern generator has in many cases typically a fixed physical size and a fixed field aperture, possibly with tapered edges. This makes it difficult to adapt for minor trends or shifts in pattern features. Interference phenomena occurring for periodic patterns are therefore difficult to mitigate.

SUMMARY

A general object of the present technology is thus to provide methods and devices based on SLMs that are adaptable for avoiding interference effects when printing repetitive patterns.

The above object is achieved by methods and devices according to the independent claims. Preferred embodiments are defined in dependent claims.

In general words, in a first aspect, a rasterization method of patterns with periodic components is presented. The method is intended for pattern generators that are based on SLMs. The SLM has an array of individually controllable elements arranged for generating an array of imaged elements within an image area on a target surface. The illumination of each individual imaged element is controlled by a respective such element. The rasterization method comprises obtaining of an original pattern, having pattern item presenting a periodicity. A first pattern main period in a first direction of the original pattern is determined. Information about the image area and a first pitch of imaged elements in the first direction of an intended pattern generator to be used are obtained. The original pattern is scaled in the first direction by a first raster scaling factor, giving a scaled pattern. The first raster scaling factor is equal to a first integer times the first pitch of the pattern generator in the first direction divided by the first pattern main period. The scaled pattern is cropped to comprise a first integer number of repetitions of the pattern items presenting a periodicity in the first direction, and including overlap tapering margins, if any, that is covered by the image area in the first direction of the intended pattern generator, giving a rasterized pattern adapted to the intended pattern generator. The rasterized pattern is associated with data representing the first scaling factor.

In a second aspect, a writing method of patterns with periodic components for pattern generators that are based on SLMs is presented. The SLM has an array of individually controllable elements arranged for generating an array of imaged elements within an image area on a target surface. The illumination of each individual imaged element is controlled by a respective element. The writing method comprises obtaining of a rasterized pattern with associated data representing a first raster scaling factor, defining scaling in a first direction of the rasterized pattern. Elements of the SLM in the pattern generator falling outside the rasterized pattern in the first direction are set to disabled. The rasterized pattern is written to an image area on a target surface. The writing comprising scaling with a first optical scaling factor in the first direction. The first optical scaling factor is non-unity.

In a third aspect, a rasterization module for pattern generators that are based on SLMs is presented. The SLM has an array of individually controllable elements arranged for generating an array of imaged elements within an image area on a target surface. The illumination of each individual imaged element is controlled by a respective element. The rasterization module comprises a processor and a memory. The memory comprises instructions executable by the processor, whereby the rasterization module is configured to obtain an original pattern, having pattern items presenting a periodicity. The rasterization module is further configured to determine a first pattern main period in a first direction of the original pattern. The rasterization module is further configured to obtain information about the image area and a first pitch $D_1$ of imaged elements in the first direction of an intended pattern generator to be used. The rasterization module is further configured to scale the original pattern in the first direction by a first raster scaling factor, giving a scaled pattern. The first raster scaling factor is equal to a first integer times the first pitch of the pattern generator in the first direction divided by the first pattern main period. The rasterization module is further configured to crop the scaled pattern to comprise a first integer number of repetitions of the pattern items presenting a periodicity in the first direction, and including overlap tapering margins, if any, that are covered by the image area in the first direction of the intended pattern generator, giving a rasterized pattern adapted to the intended pattern generator. The rasterized pattern is associated with data representing the first raster scaling factor.

In a fourth aspect, a pattern generator comprises a control module and an imaging module. The imaging module is arranged for writing a pattern to an image area by means of SLMs. The SLM has an array of individually controllable elements arranged for generating an array of imaged elements within an image area on a target surface. The illumination of each individual imaged element is controlled by a respective element. The control module is configured for obtaining a rasterized pattern with associated data representing a first raster scaling factor, defining scaling in a first direction of the rasterized pattern. The control module is further configured for setting elements of the SLM in the pattern generator arrangement falling outside the rasterized pattern in the first direction to disabled. The imaging module comprises optical means, controlled by the control module, for scaling the rasterized pattern with a first optical scaling factor in the first direction before being written to the image area. The first optical scaling factor is non-unity.

One advantage with the proposed technology is that the performance of the SLM can be adapted to any periodic patterns. Other advantages will be appreciated when reading the detailed description.

BRIEF DESCRIPTION OF THE DRAWINGS

The invention, together with further objects and advantages thereof, may best be understood by making reference to the following description taken together with the accompanying drawings, in which.

DETAILED DESCRIPTION

Throughout the drawings, the same reference numbers are used for similar or corresponding elements.

For a better understanding of the proposed technology, it may be useful to begin with a brief overview of the geometry considerations in pattern generators being based on SLMs.

Figure 1:
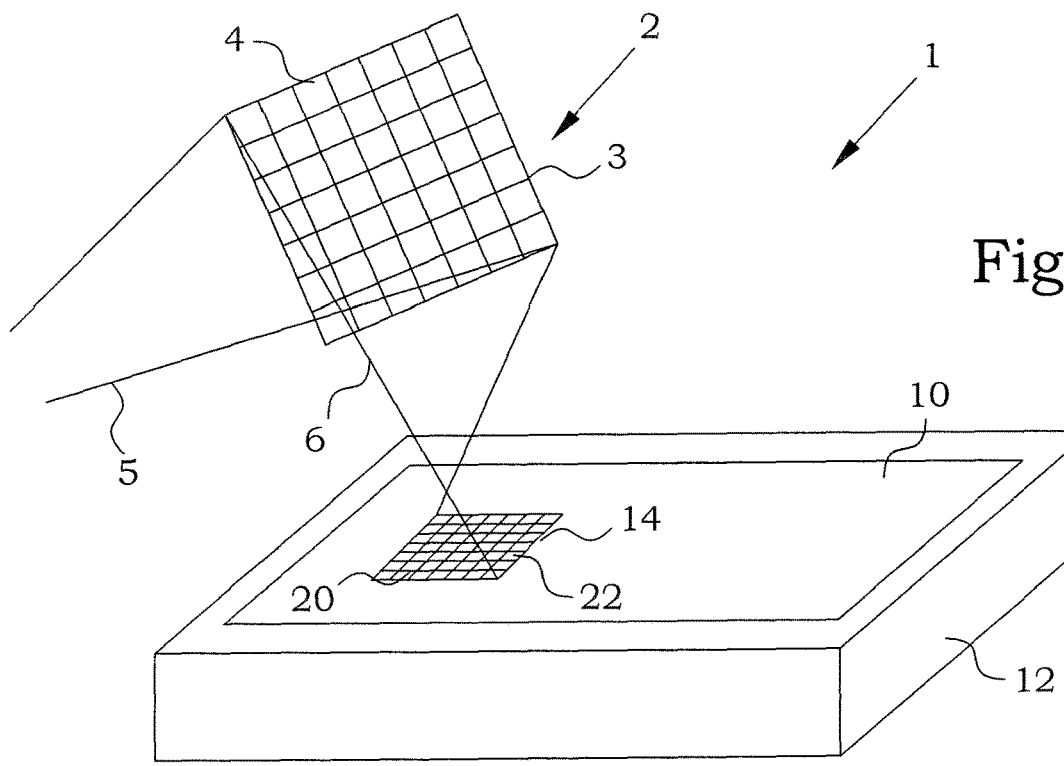
FIG. 1 illustrates schematically a pattern generator based on an SLM.

FIG. 1 illustrates schematically a pattern generator 1 based on an SLM 2. The SLM 2 is here illustrated as an array 3 of individually controllable elements 4, in this embodiment radiation reflecting elements. Light 5 impinging on the array 3 will be reflected into a set of exposure beams 6 towards a target surface 10. The target surface 10 is typically supported by a target support 12. The individual elements 4 of SLM 2 is controllable to admit reflection or to suppress reflection. Elements 4 of the SLM 2 may also be set to be disabled, thereby reducing the active part of the array 3.

The light leaving the active part of the SLM 2 is directed to the target surface 10, on which they form an array 20 of imaged elements 22. Together, the imaged elements 22 forms an imaged area 14. The illumination of each individual imaged element 22 is thereby controlled by a respective element 4 of the SLM 2. Typically, there is a nominal optical scaling of the imaged area 14 in relation to the SLM array 20. This nominal scaling is a uniform scaling determined by different design parameters, such as different distances, and by ordinary optics. The arrangements for achieving such a nominal scaling are well-known by any person skilled in the art and are not further discussed.

The SLM 2 can be configured in many different ways, as noted in the 5 background. The details of the operation of the SLM 2 is not of crucial importance for the present ideas, as long as the individual control of the elements 4 is provided and the SLM 2 gives rise to the array 20 of imaged elements 22 in the imaged area 14 on the target surface 10.

After an exposure of the imaged area 14 according to the individual settings of the elements 4 of the SLM 2, the imaged area 14 can be moved. This may typically be performed by mechanically moving the SLM 2 relative the target support 12, by moving the target support 12, the SLM 2 or both. The movement of the imaged area 14 may also at least partly be performed by optical means.

Figure 2:
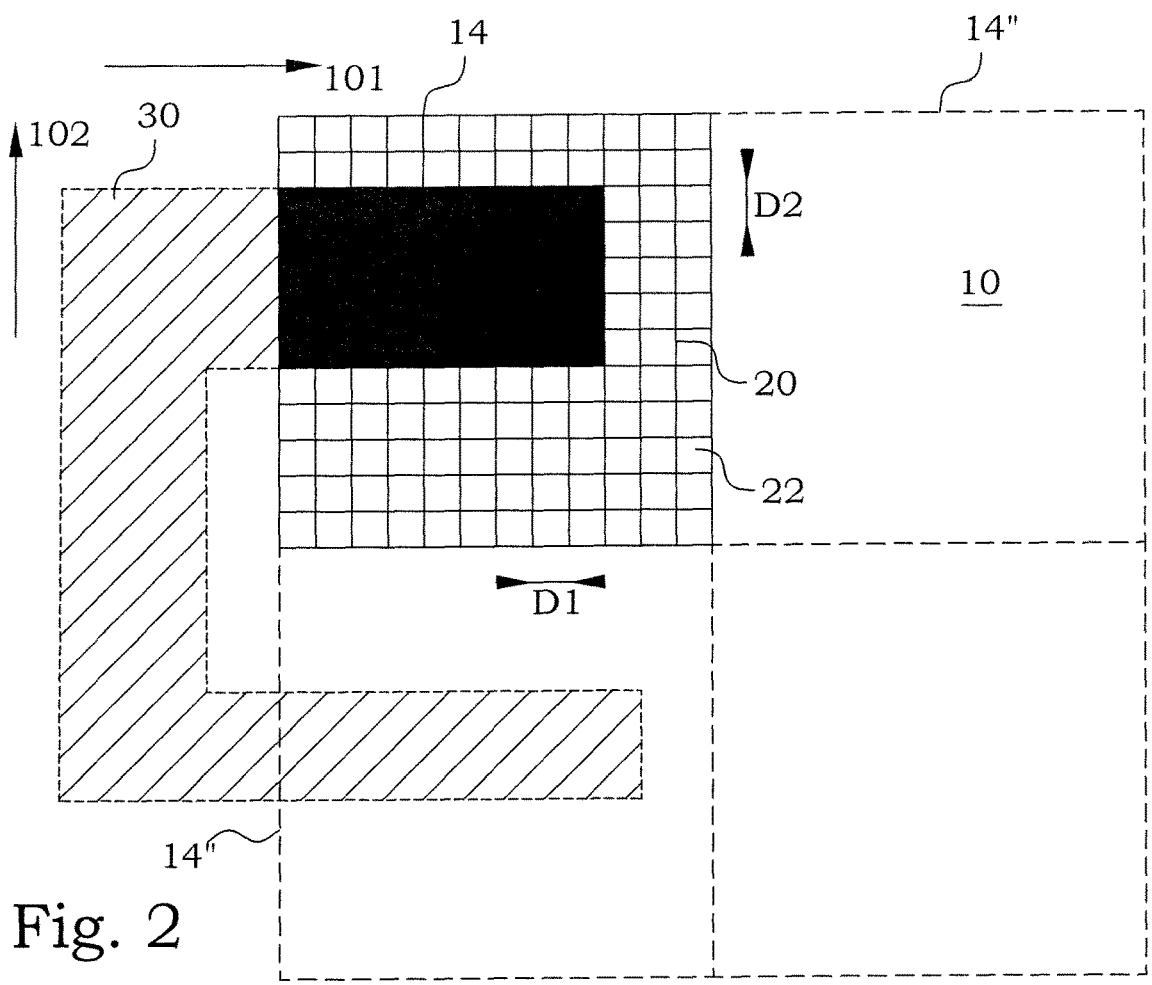
FIG. 2 illustrates schematically a part of a target surface.

FIG. 2 illustrates schematically a part of a target surface 10. An imaged area 14 of a present position of an SLM is depicted as an array 20 of imaged elements 22. The imaged elements 22 are provided with a first pitch D1 in a first direction 101 and with a second pitch D2 in a second direction 102. In the present illustration, the number of imaged elements is small, for illustrational purposes. In the present situation, some of the elements of the SLM allows radiation to be directed to the imaged area 14 and are marked as black. The selection of elements at the SLM is made according to print data representing a pattern 30 intended to be printed. The intended pattern 30 is shown in dotted lines only as a reference and is not physically present at the imaged area 14. However, it can easily be seen that imaged elements 22 that correspond to items in the pattern 30 are illuminated, whereas image elements 22 corresponding to areas between items in the pattern 30 are not illuminated. The areas of the intended pattern 30 falling outside the present imaged area 14 are marked as hatched and will be handled by a previous or subsequent printing step.

It could be noticed that in certain applications, the illumination could be the negative correspondence to the pattern 30, i.e. that only imaged elements 22 outside the intended pattern are illuminated. However, this would be analogue to a "negative" pattern 30.

Returning to FIG. 2, when an imaged area 14 has been illuminated, a movement of the imaged area 14 may be performed before a next exposure is made. In the Figure, an example of a next position is indicated by broken lines 14".

Another part of the pattern 30 can then be exposed into the target surface 10. In such a way, the entire surface of the target surface 10 can be covered.

Here, it should be noticed that the displacement of the imaged area 14 also may be performed with a small overlap. Each pattern intended to correspond to the imaged area 14 may then include a tapering margin, in order to avoid edge effects between different imaged areas. This will be discussed further below. Another possibility is to use multiple exposures, where the imaged area 14 is moved only a fraction of the width of the imaged area 14, leading to that each point at the target surface 10 may be exposed a plurality of times. Such embodiments will be discussed more further below. It is also possible to perform more than one exposure of a same imaged area 14, i.e. without any movement between the exposures.

Figure 3:
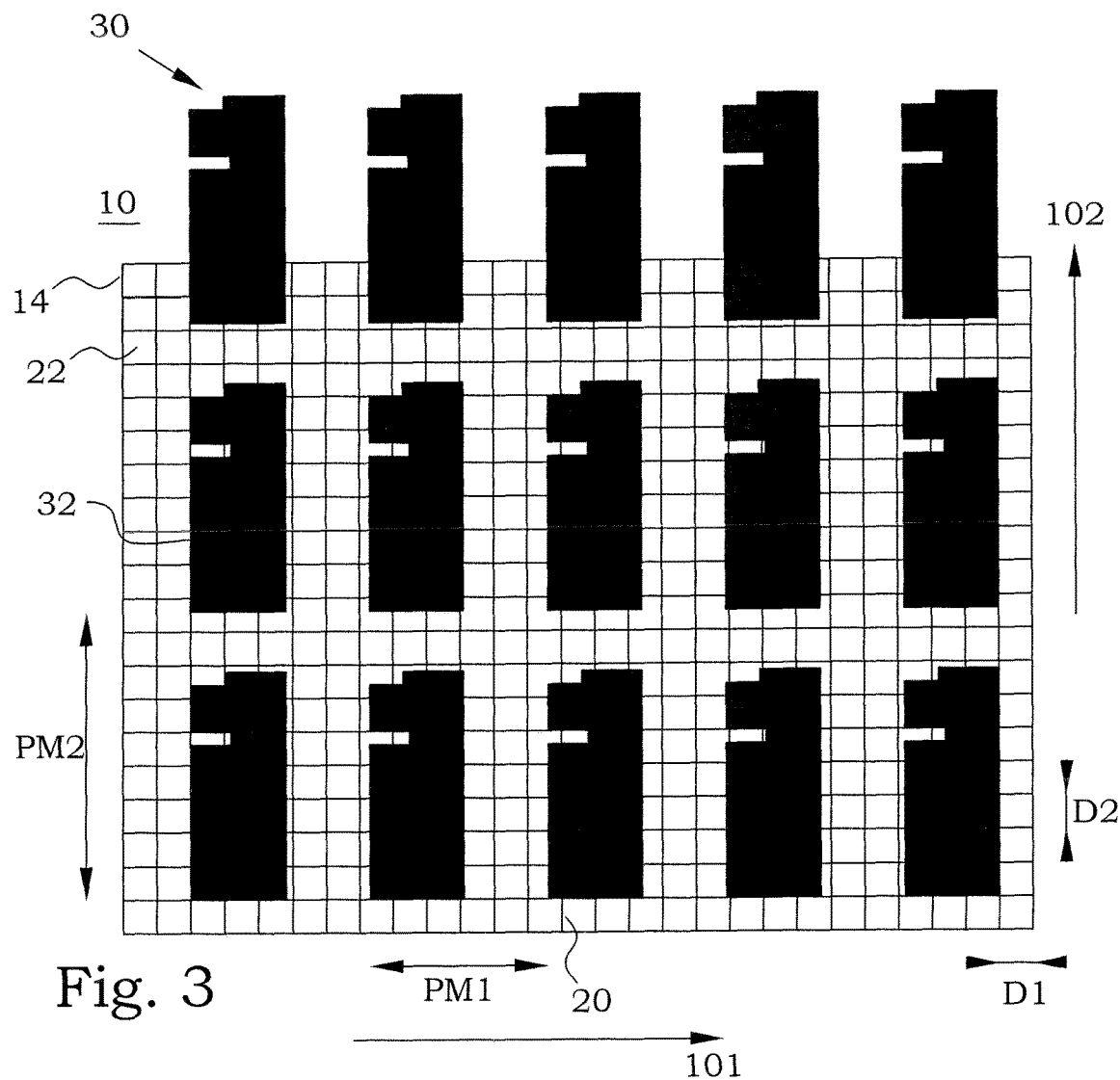
FIG. 3 illustrates a part of another target surface.

FIG. 3 illustrates a part of another target surface 10. The pattern 30 to be exposed into the target surface 10 is also shown, but only as a reference. The present pattern 30 is a periodic pattern, having items 32 presenting a periodicity. The pattern 30 presents a first pattern main period PM1 in the first direction 101 and a second main period PM2 in the second direction 102. It can here be seen that the items 32 of the pattern 30 are placed somewhat differently with respect to the imaged elements 22 that they cover. The reason for this is that the first pattern main period PM1 is not a multiple of the first pitch D1 of imaged elements 22, and the second pattern main period PM1 is not a multiple of the second pitch D1 of imaged elements 22. The lower left corner of the items 32 thus have different positions relative the lower left corner of an imaged element 22. The items 32 are thus displaced a small distance between each repetition, typically in both horizontal and vertical direction. Such small repetitive displacements can, as discussed in the background, give rise to different interference effects giving Mura problems.

The present ideas are presented in order to mitigate such effects. The basic idea is to use a two-part approach. In a first part, the print data of the pattern to be printed is modified to have a periodicity that agrees with the periodicity of the SLM. This is thereby a recomputing of data forming the base on which a subsequent printing is made. In the second part, the actual printing is made according to the recomputed print data. However, in order to achieve requested absolute and relative sizes, this writing is performed utilizing scaling with optical scaling factors in the respective directions.

Figure 4:
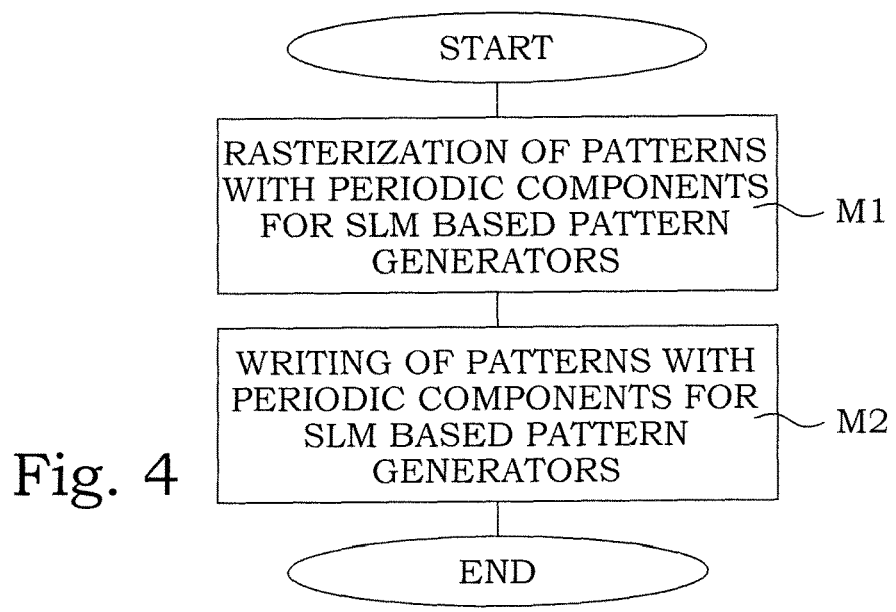
FIG. 4 is a flow diagram of methods of an embodiment of a general method for pattern generation.

FIG. 4 illustrates a flow diagram showing this relationship. Part method M1 is a rasterization method of patterns with periodic components for pattern generators being based on SLMs. Part method M2 is a writing method of patterns with periodic components for pattern generators being based on SLMs. These methods may be performed in connection with each other and may even utilize the same processing equipment. However, the methods can also be performed separately from each other, only connected by transferring a rasterized pattern and associated information of part method M1 to be used in part method M2.

The effects of the first part method will now be described in connection with a series of Figures. These figures are imaginary situations of a patterns at an imaged area at a target surface corresponding to the manipulations that are made to the print data of the pattern. However, in this first part method, no actual writing is performed, and all manipulations are made only to the representation of the print data of the pattern.

Figure 5:
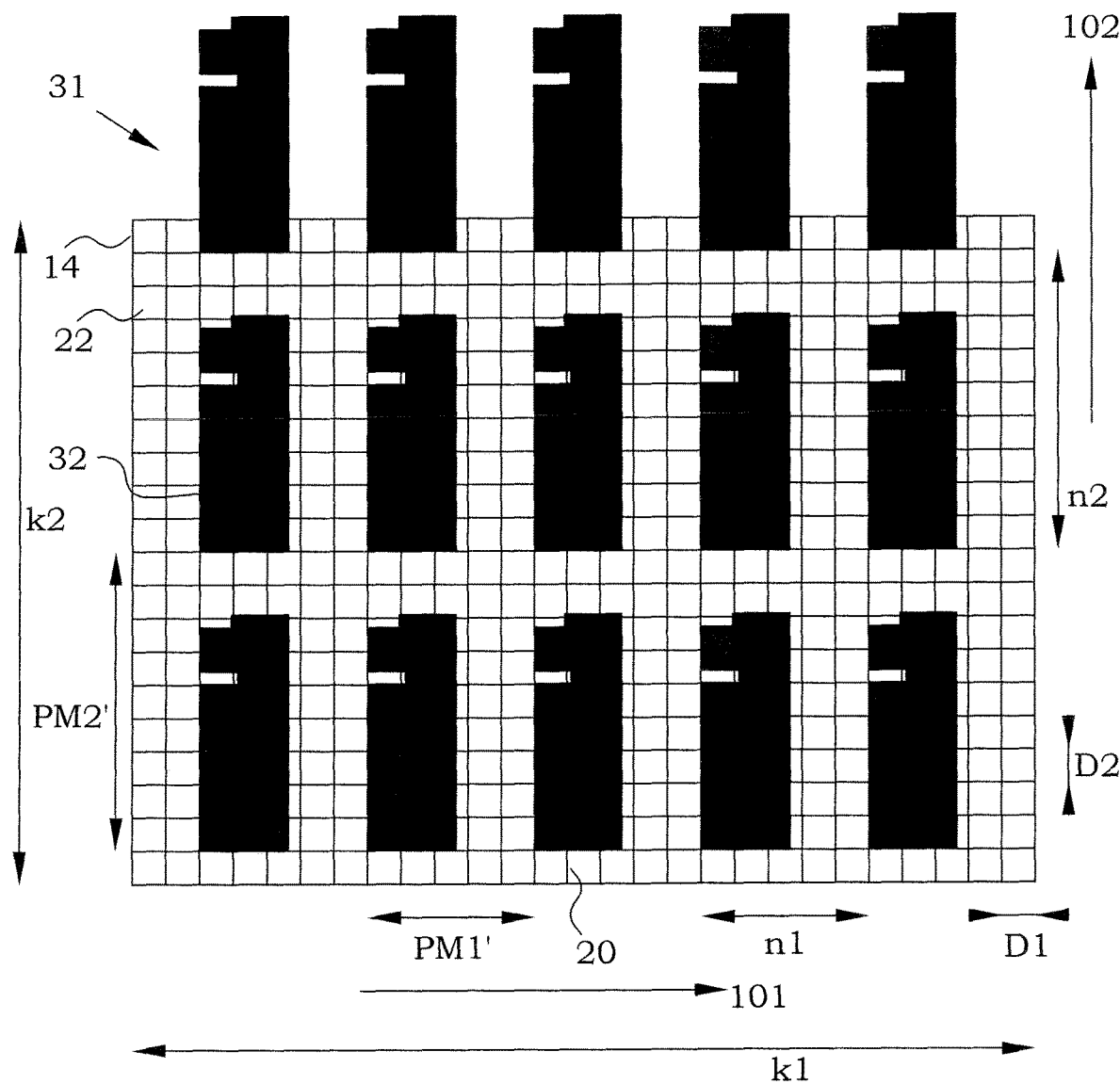
FIG. 5 illustrates a part of a scaled pattern at a target surface.

In the FIG. 3, it was seen that there was a discrepancy between the repetitive items and the array of imaged elements. In FIG. 5, the same pattern has been scaled into a scaled pattern 31. In the first direction 101, the pattern is scaled by a first raster scaling factor, F1. In this particular example, F1 is slightly below unity, making the scaled pattern 31 narrower that the original pattern. This scaling changes the first pattern main period PM1 into a first scaled pattern main period PM1' to fit to a first integer n1 times the first pitch D1 of the SLM in the first direction 101.

If the original first pattern main period PM1, the first pitch D1 of the SLM and a suitable first integer n1 is known, the first raster scaling factor F1 can be calculated as:

$$F1 = PM1'/PM1 = n1*D1/PM1.$$

In the second direction 102, the pattern is scaled by a second raster scaling factor, F2. In this particular example, F2 is slightly above unity, making the scaled pattern 31 taller that the original pattern. This scaling changes the second pattern main period PM2 into a second scaled pattern main period PM2' to fit to a second integer n2 times the second pitch D2 of the SLM in the second direction 102.

If the original first pattern main period PM1, the first pitch D1 of the SLM and a suitable first integer n1 is known, the first raster scaling factor F1 can be calculated as:

$$F2 = PM2'/PM2 = n2*D2/PM2.$$

The scaled pattern 31 now fits perfectly to the raster of the SLM. Each part of the repeated items 32 appears in a same relation to an imaged element 22. For instance, the left lower corner of the illustrated items 32 now coincides with a corner of an imaged elements 22 somewhere else within the imaged area 14.

The imaged area 14 comprises totally k1 imaged elements 22 in the first direction 101. The imaged area 14 also comprises totally k2 imaged elements 22 in the second direction 102. However, in most cases, where the number k1 of imaged elements 22 in the first direction 101 is not a multiple of the first integer n1, an item of the scaled pattern 31 may partly fall outside the imaged area 14. Likewise, in most cases, where the number k2 of imaged elements 22 in the second direction 102 is not a multiple of the second integer n1, an item of the scaled pattern 31 may also partly fall outside the imaged area 14.

Figure 6:
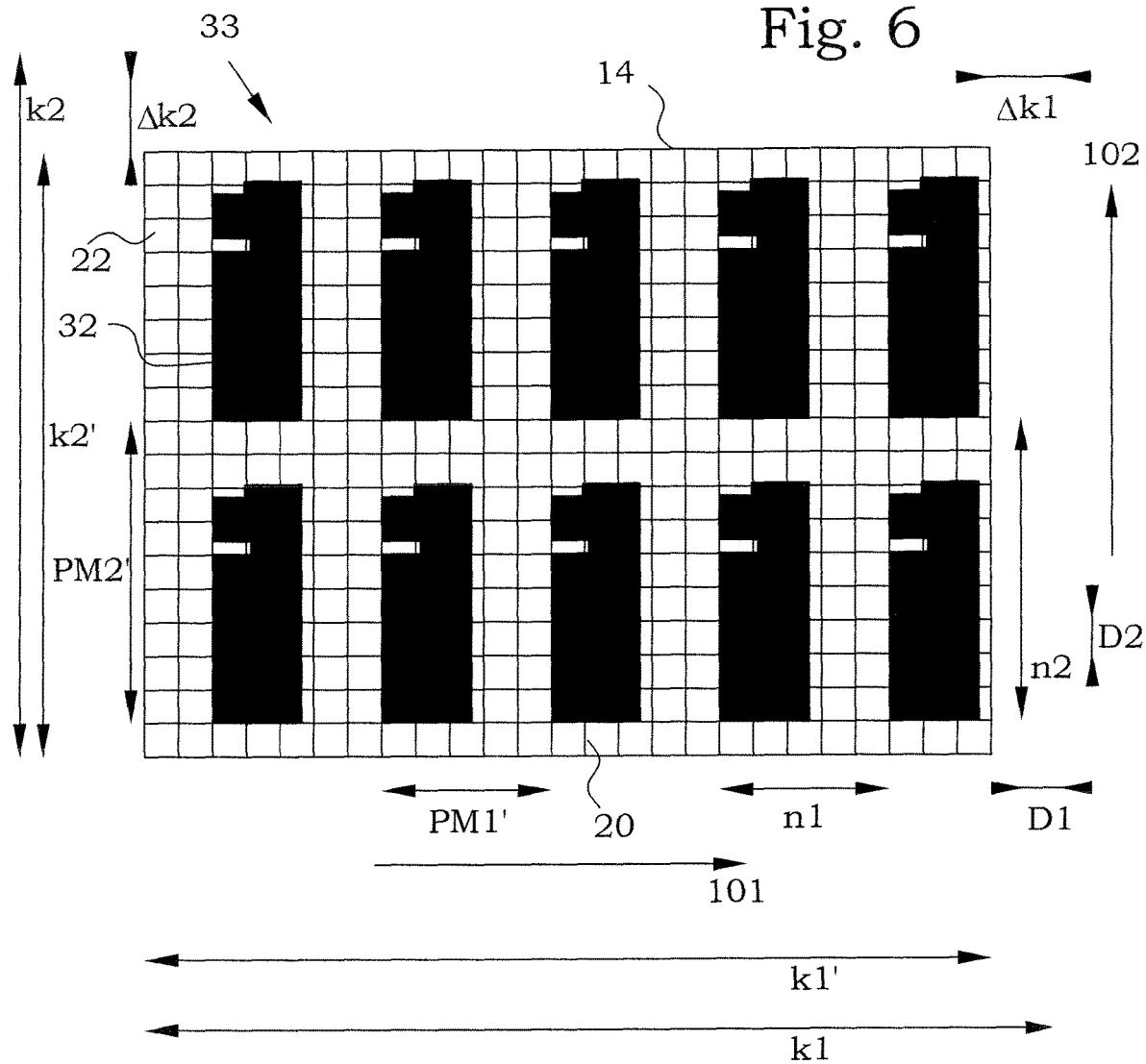
FIG. 6 illustrates a part of a scaled and cropped pattern at a target surface.

In order to avoid such partly covered items, a cropping of the pattern is made. This is schematically illustrated in FIG. 6. The number k1 of imaged elements 22 in the first direction 101 is cropped by a first difference Δk1, leaving k1' imaged elements 22 in the first direction 101. This number k1' of imaged elements 22 in the first direction 101 is selected to be a multiple of the first scaled pattern main period PM1'. In other words:

$$K1' = L1*PM1',$$

where L1 is an integer.

Likewise, the number k2 of imaged elements 22 in the second direction 102 is cropped by a second difference Δk2, leaving k2' imaged elements 22 in the second direction 102. This number k2' of imaged elements 22 in the second direction 102 is selected to be a multiple of the second scaled pattern main period PM2'. In other words:

$$K2' = L2*PM2',$$

where L2 is an integer.

A rasterized pattern 33 is thus created. The rasterized pattern is adapted to the intended pattern generator. The rasterized pattern is also associated with data representing the first and second scaling factors, in order to enable a restoration of the original size and shapes.

Figure 7:
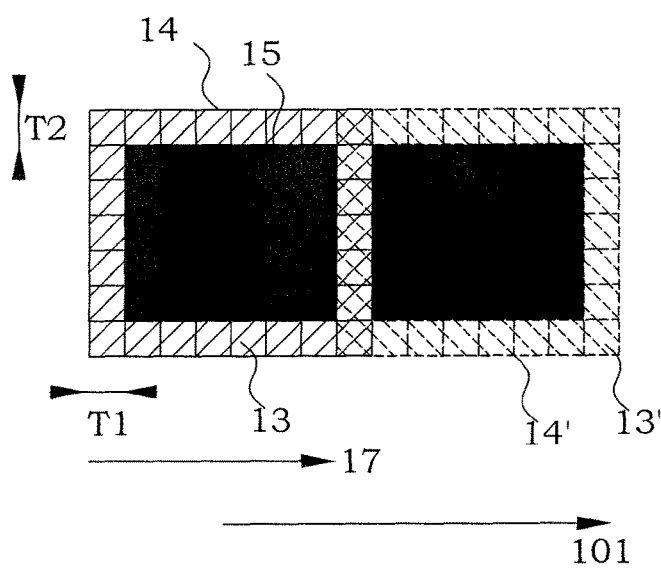
FIG. 7 illustrates schematically tapering margins in pattern generators based on SLM.

In the case the pattern generator utilizes the approach of having overlap tapering margins, as discussed above, such margins have to be included in the rasterized pattern. FIG. 7 illustrates schematically tapering margins in pattern generators based on SLM. A present imaged area 14 is illustrated with a central region 15, illustrated as black areas, having a regular rasterized pattern. In a tapering region 13, in one or two directions around the central region 15, also comprises a rasterized pattern, but typically with a reduced intensity. In one embodiment, the intensity is reduced from the full one at the border of the central region 15 to a zero intensity at the outer border. The width of the tapering region is T1 in the first direction 101 and T2 in the second direction 102, in the illustrated example. A next imaged area 14' is illustrated with dotted lines. The next imaged area 14' is moved a distance 17 in the first direction with respect to the present imaged area 14. It can be seen that the tapering regions 13, 13' of the present and next image are 14, 14', respectively, overlap, which means that another exposure of these areas is performed by the next image area 14'. Together this double exposure creates a pattern in the imaged element that is similar to what would have been produced by an imaged element in the central region. The use of tapering margins is believed to reduce edge effects of the imaged areas 14, 14'.

The cropping according to the present ideas has to be adapted to the tapering regions, if used. Therefore, one embodiment of the rasterization method comprises the further step of performing an overlap intensity tapering of edges of the rasterized pattern.

In such cases, cropping should be made according to:

$$K1'=L1*PM1'+T1, \text{ and}$$

$$K2'=L2*PM2'+T2,$$

where T1 and T2 are the width (in pitch distances) of the overlap tapering margins in the first and second directions 101, 102, respectively.

In the above presented example, the treatment of the periodic pattern has been performed in both directions. However, in certain applications, e.g. where the periodicity of the pattern only is present in one direction, the corresponding treatment can of course be made, however, only in one direction.

Figure 8:
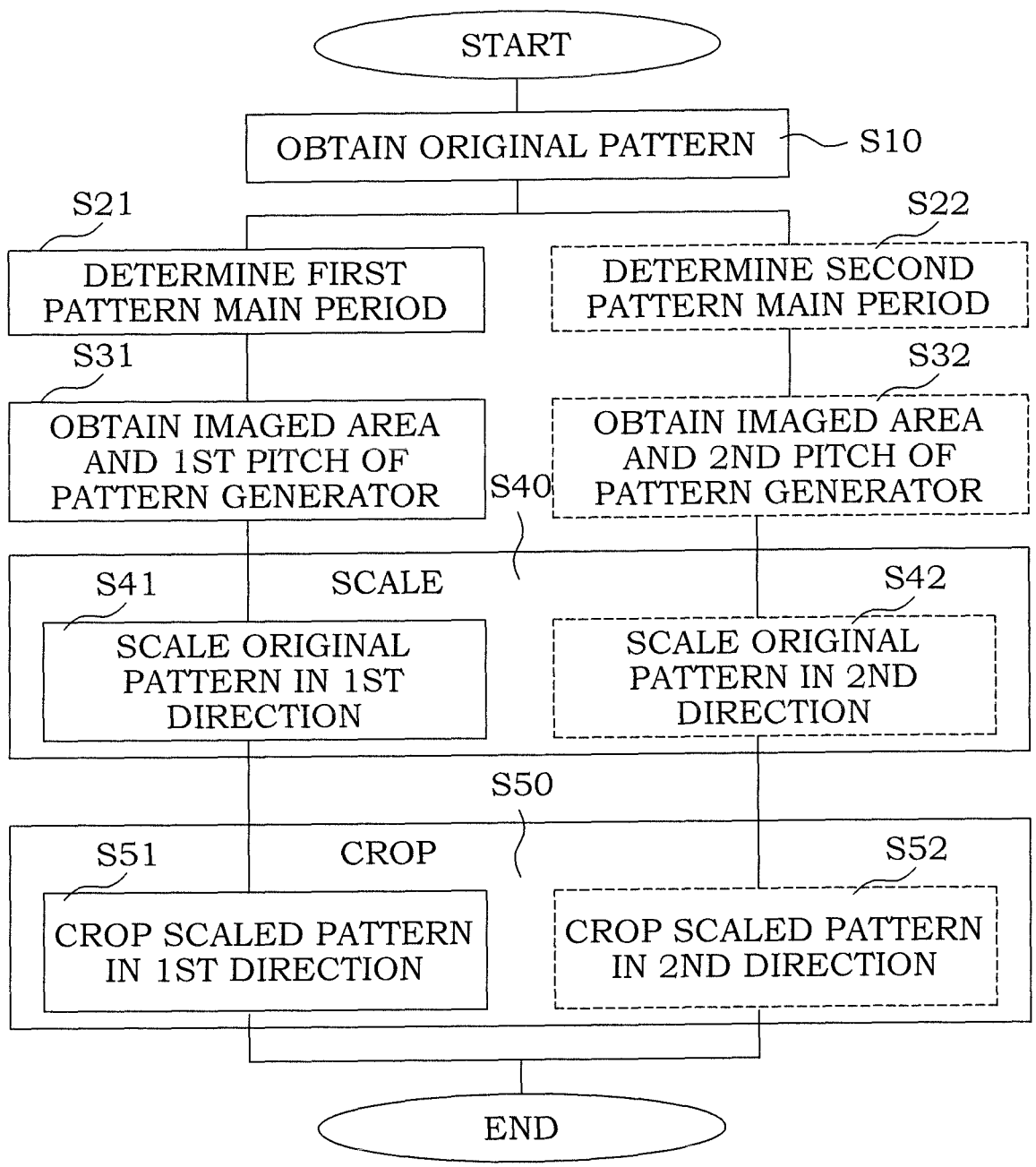
FIG. 8 is a flow diagram of steps of an embodiment of a rasterization method of patterns with periodic components for pattern generators being based on SLMs.

FIG. 8 illustrates a flow diagram of steps of an embodiment of a rasterization method of patterns with periodic components for pattern generators being based on SLMs. The SLM has an array of individually controllable elements arranged for generating an array of imaged elements within an image area on a target surface, where illumination of each individual imaged element is controlled by a respective element. In step S10, an original pattern is obtained.

The original pattern has pattern item presenting a periodicity. In step S21 a first pattern main period $P_{M1}$ in a first direction of the original pattern is determined. In step S31, information about the image area and a first pitch $D_1$ of imaged elements in the first direction of an intended pattern generator to be used is obtained. In step S40, a scaling of the original pattern is performed. In a part step S41, the original pattern is scaled in the first direction by a first raster scaling factor, giving a scaled pattern. The first raster scaling factor is equal to a first integer times the first pitch of the pattern generator in the first direction divided by the first pattern main period. In step S50, a cropping is performed. In a part step S51, the scaled pattern is cropped to comprise a first integer number of repetitions of the pattern items presenting a periodicity in the first direction, and including overlap tapering margins, if any, to be covered by the image area in the first direction of the intended pattern generator. This gives a rasterized pattern adapted in one direction to the intended pattern generator. The rasterized pattern is associated with data representing the first scaling factor.

The steps presented above takes care of original patterns being repeated in (at least) one direction. In implementations where the pattern is repeated only in one direction, these steps will be enough for mitigating the different Mura effects.

In the examples further above, a two-dimensional SLM has been assumed. However, the present ideas are also applicable on one-dimensional SLMs. The above steps will then mitigate Mura effects in the direction of the SLM array, while any possible Mura effects in an orthogonal direction have to be taken care of by other means, which fall outside the scope of the present ideas.

In case the original pattern has a periodicity also in the second direction and the SLM is a two-dimensional SLM, additional steps may be performed. In step S22, a second pattern main period PM2 in a second direction of the original pattern is determined. The second direction is orthogonal or at least transverse in relation to the first direction. In step S32, information about the image area and a second pitch $D_2$ of imaged elements in the second direction of the intended pattern generator to be used is obtained. In the step S40 of scaling the original pattern, a further step S42 further comprises scaling of the original pattern also in the second direction by a second raster scaling factor, giving the scaled pattern. The second raster scaling factor is equal to a second integer times the second pitch of the pattern generator in the second direction divided by the second pattern main period. The step of cropping S50 further comprises the step S52 where the scaled pattern also is cropped to comprise a second integer number of repetitions of the pattern items presenting a periodicity in the second direction, and including overlap tapering margins, if any, to be covered by the image area in the second direction of the intended pattern generation, giving the rasterized pattern. The rasterized pattern is thereby further associated with data representing the second raster scaling factor.

From this method, a rasterized pattern, or rather a definition of a rasterized pattern, operating as print data, is obtained. Associated with this rasterized pattern are the raster scaling factors.

When performing the actual writing, the rasterized pattern and its associated raster scaling factors are obtained. If the writing is to be performed by the same entity as was responsible for the rasterization, all data is already available, and the rasterized pattern can typically be obtained by a simple retrieving from a memory. If the writing is to be performed by another entity, the pattern has to be obtained by transferring data representing the rasterized pattern and its associated raster scaling factors to the entity performing the writing.

Figure 9:
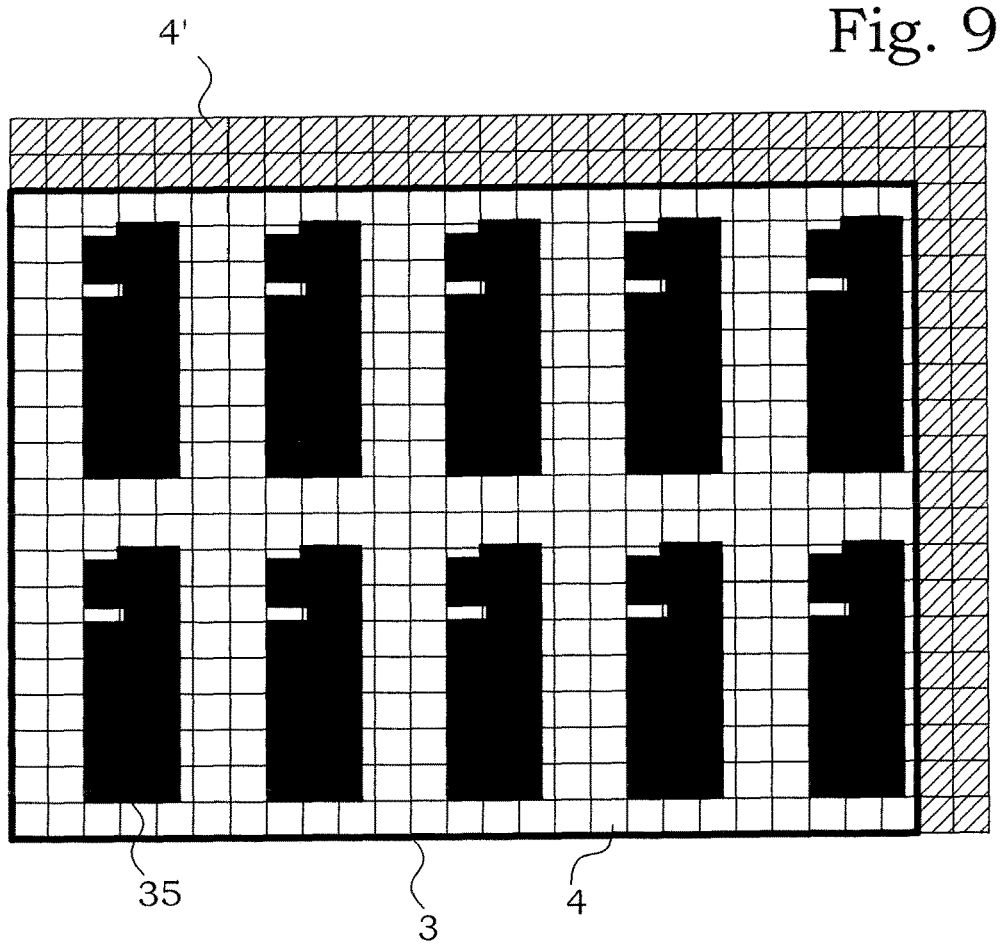
FIG. 9 illustrates an SLM array overlaid with a rasterized pattern.

FIG. 9 illustrates schematically the obtained rasterized pattern 35 overlaid over the array 3 of elements 4 in the SLM that is to be used. As being described above, the cropping may cause that the rasterized pattern 35 does not utilize all elements 4 of the SLM. In other words, some of the elements of the SLM will be of no use during the printing. Therefore, it is first checked which part of the elements of the SLM in the pattern generator that falls outside the rasterized pattern. These elements denoted as 4' are then set to be disabled, and are illustrated as hatched in the illustration. In other words, an optical cropping is performed in analogy with the cropping during the rasterization phase.

In the illustrates case, the disabled elements are shown at one edge of the SLM. However, it may also be possible to disable elements on both sides of the remaining pattern, in one or both directions.

The rasterized pattern may be somewhat distorted compared to the original pattern as provided as input to the rasterization method. In most embodiment, there is an aim to restore such distortions. To this end, the pattern generator has an imaging module arranged for writing a pattern to an image area. This image module comprises optical means that are configures for performing an optical scaling of the pattern when it is written to the image area. This scaling can be controlled to be different in different direction.

By using such an optical scaling, the scaling factors associated with the rasterized pattern can be used to control the optical scaling during the writing of the pattern. In cases where the original shape of the items in the pattern is to be restored, the used optical scaling factors are selected to be equal to the inverse of the respective raster scaling factors.

The optical scaling is performed between the SLM and the target area and is provided as an adjustment of or overlay to the nominal optical scaling between an SLM and a target surface in the pattern generator, that was discussed further above. In such a way, the SLM acts on a rasterized pattern, adapted to the division of the SLM into an array of elements. At the same time, the radiation that reaches the target area is restored to recreate the original shapes, by means of the optical scaling.

Figure 10:
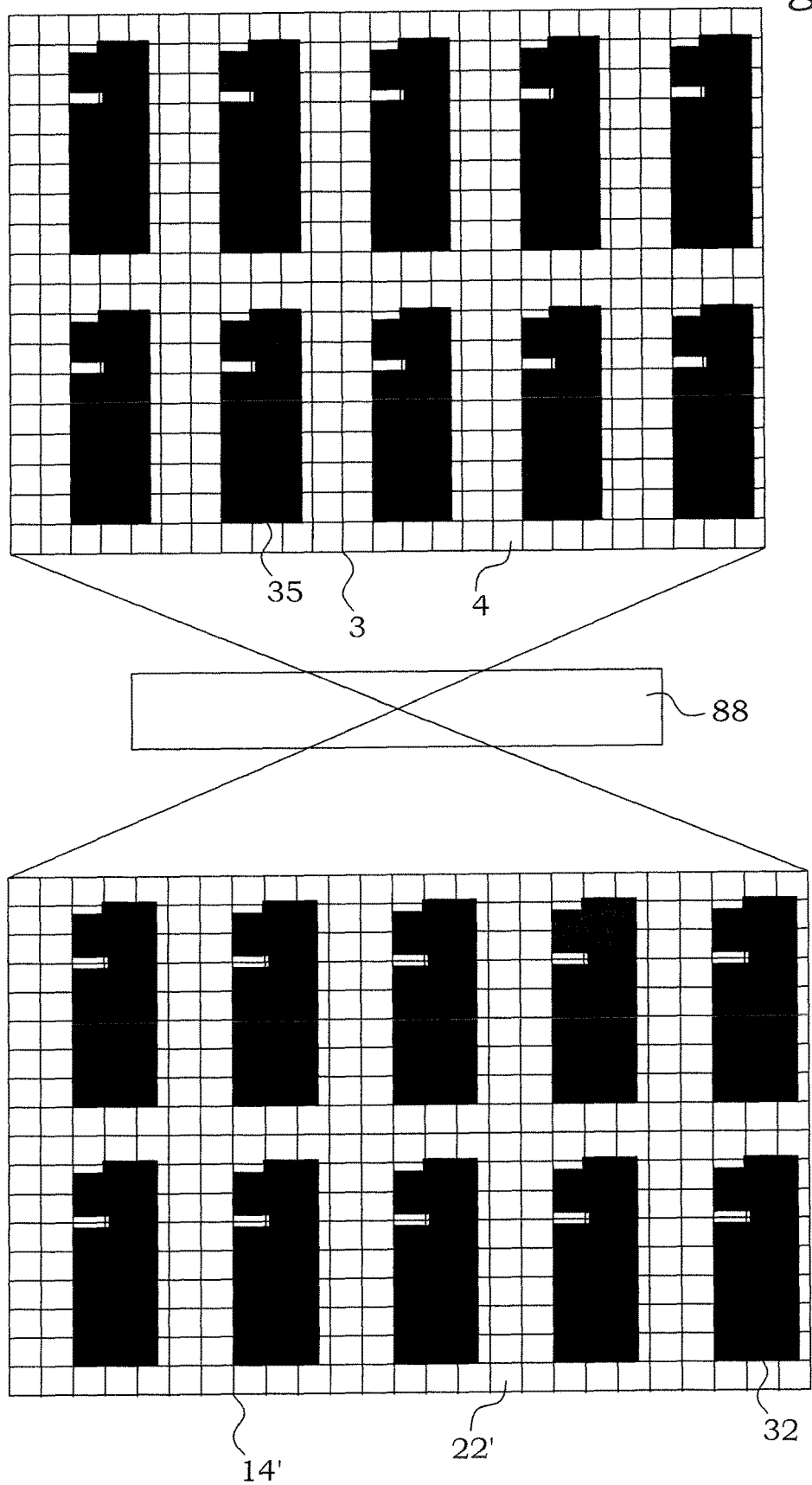
FIG. 10 illustrates schematically an embodiment of an optical scaling of a pattern between an SLM and a target area.

FIG. 10 illustrates schematically this optical scaling. The radiation that passes the SLM is represented by the upper part of FIG. 10. This pattern still presents the shapes of the rasterized pattern. The lower part of FIG. 10 illustrates the pattern as written on the target area, i.e. after having passed the optical scaling of the imaging module. The imaged elements 22' are rescaled according to the optical scaling and covers a scaled imaged area 14' that differs from the nominal one. However, the shapes of the items 32 are restored to the originally intended shape.

In the above presented example, the actions influencing the written patterns have been performed in both directions. However, in analogy with what was discussed in the rasterization part method, in certain applications, e.g. where the periodicity of the pattern only is present in one direction, the corresponding actions can of course be made, however, only in one direction.

In some applications, there are no definite requests of maintaining the exact shapes during the writing process. In certain such applications, there might even be a wish to obtain a certain remaining shape change of the written pattern. In such applications, the applied optical scaling may be different from the inverse of the respective raster scaling factors.

Figure 11:
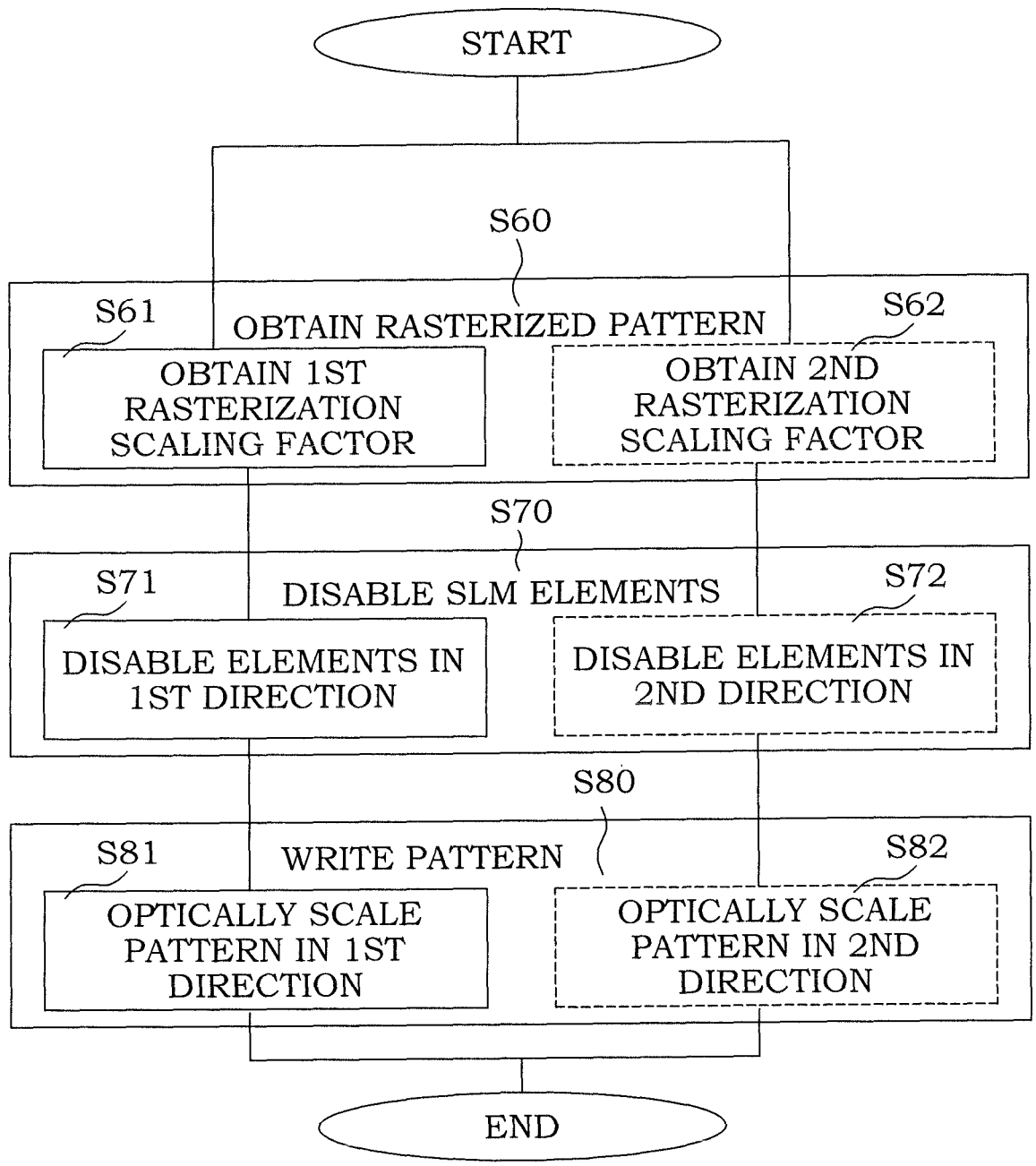
FIG. 11 is a flow diagram of steps of an embodiment of a writing method of patterns with periodic components for pattern generators being based on SLMs.

FIG. 11 is a flow diagram of steps of an embodiment of a writing method of patterns with periodic components for pattern generators being based on SLMs. The SLM has an array of individually controllable elements arranged for generating an array of imaged elements within an image area on a target surface, where illumination of each individual imaged element is controlled by a respective element. In step S60, a rasterized pattern is obtained. In part step S61, data representing a first raster scaling factor associated with the rasterized pattern is obtained. This first raster scaling factor defines scaling in a first direction of the rasterized pattern. In step S70, elements of the SLM are set to be disabled. In part step S71, elements of the SLM in the pattern generator falling outside the rasterized pattern in the first direction are set to be disabled. In step S80, the rasterized pattern is written to an image area on a target surface. In part step S81, the writing comprises scaling with a first optical scaling factor in the first direction. The first optical scaling factor is non-unity.

In a particular embodiment, the first optical scaling factor is equal to the inverse of the first raster scaling factor.

In case the original pattern has a periodicity also in the second direction, additional steps may be performed. The step of obtaining S60 a rasterized pattern is may comprise the part step S62, in which the rasterized pattern is further associated with data representing a second raster scaling factor. The second raster scaling factor defines scaling in a second direction of the rasterized pattern. The second direction is orthogonal or at least transverse in relation to the first direction. The step of setting elements of the SLM to disabled S70 further comprises step S72, in which elements of the SLM in the pattern generator falling outside the rasterized pattern in the second direction are set to disabled. The step S80 of writing further comprises step S82, in which scaling with a second optical scaling factor in the second direction is performed.

In a particular embodiment, both the first optical scaling factor and the second optical scaling factor are non-unity.

In a particular embodiment, the second optical scaling factor is equal to the inverse of the second raster scaling factor.

In the examples given above, both the repetitive pattern and the array of elements of the SLM present orthogonal main axes of symmetry. The array of imaged elements at the target surface is also assumed to be parallel with the intended directions of the periodic pattern. However, in other embodiments other relationships and geometries are also possible to utilize.

One simple example is an array of an SLM having a rectangular geometry, i.e. where the distance between two neighboring elements are different in the two orthogonal directions. This is quite straightforward to use since the two directions anyway are handled separately and different pitch values can be entered.

Figure 12:
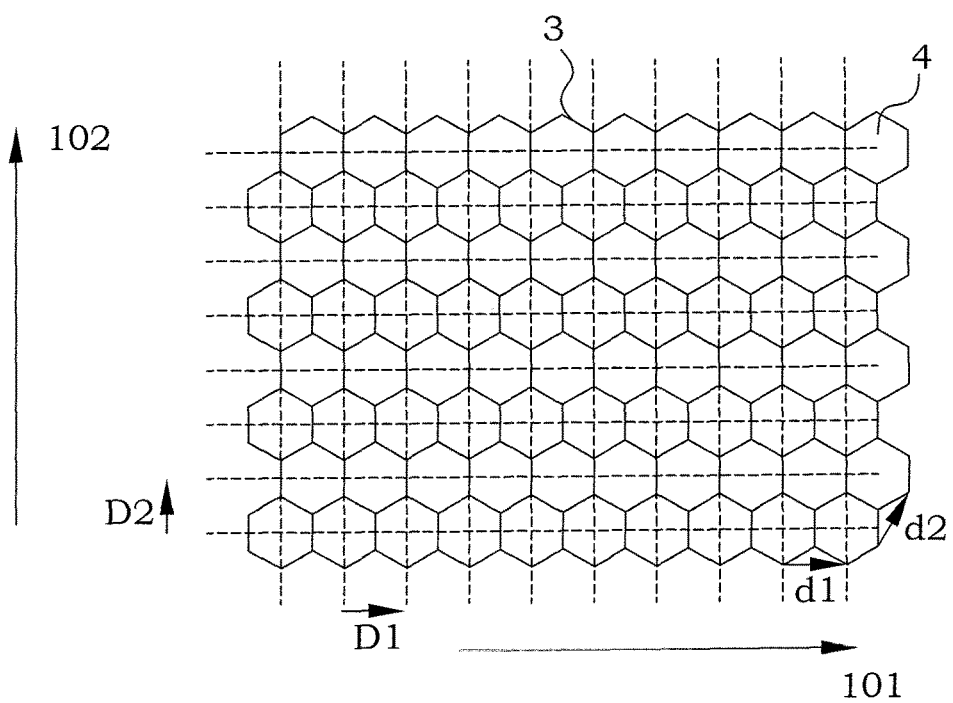
FIG. 12 illustrates schematically an embodiment of an SLM array having non-orthogonal main symmetry axes.

In one embodiment, the element array of the SLM can be arranged with non-orthogonal axes. One example is to use an SLM with a hexagonal symmetry. The main symmetry axes of the element array are then directed 60° with respect to each other. The imaged elements are then also exhibiting a hexagonal symmetry. One of the axes of the array of imaged elements may coincide with e.g. the first direction of array of the periodic pattern. The pitch in this direction will then be the distance between two successive imaged elements in this direction. However, the pitch in the orthogonal direction will instead be the distance in the second direction between two lines in the first direction of imaged elements, i.e. the distance between the imaged element rows. In the present example, the pitch in the second direction will be dependent on the distance between two neighboring imaged elements and on the angle 60°. This is schematically illustrated FIG. 12. The distance between neighboring imaged elements is d1 and d2, respectively in the main symmetry directions. The pitch D1 in the first direction equals d1, while the pitch D2 in the second direction becomes dependent on the distance d2 modified dependent on the angle between the second main symmetry axis and the second direction.

Figure 13:
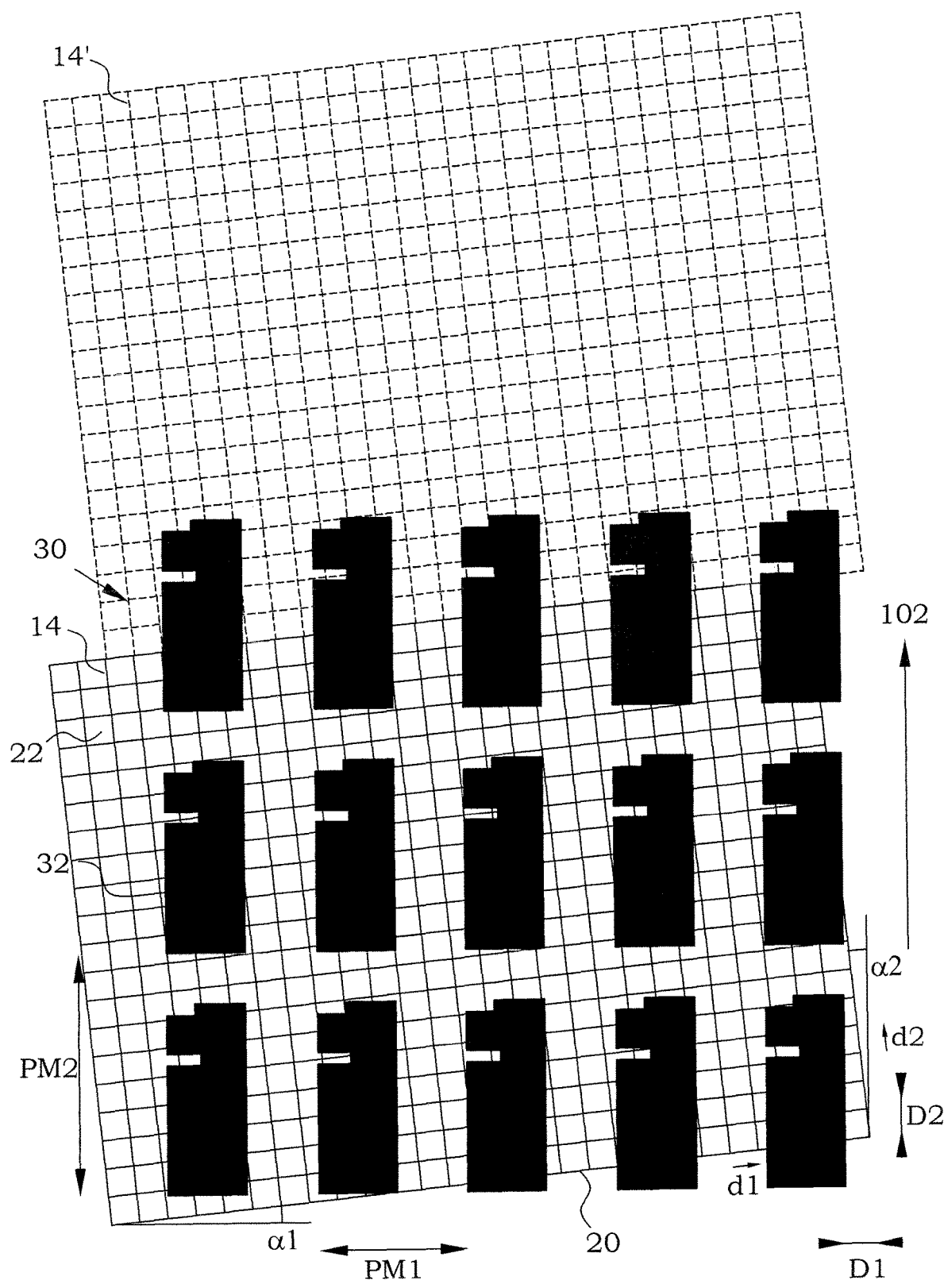
FIG. 13 illustrates schematically an embodiment of a non-aligned SLM.

Another example of a relative geometry that can be used is to use an SLM array that gives rise to an array of imaged elements that is non-aligned with the symmetry axes of the periodic pattern. Such a situation is illustrated in FIG. 13. One present imaged area 14 is illustrated together with a next imaged area 14' (dotted lines). The symmetry axes of the imaged elements are rotated an angle α1 and α2, respectively, clockwise with respect to the first and second directions, respectively. In most cases, the angle α1 is equal to angle α2.

In other words, in one embodiment, a first main axis of the array of imaged elements is rotated with a first angle in relation to the first direction, whereby the first pitch is dependent on the distance between two consecutive imaged elements along the first main axis and on the first angle.

In a further embodiment, a second main axis of the array of imaged elements is rotated with a second angle in relation to the second direction, whereby the second pitch is dependent on the distance between two consecutive imaged elements along the second main axis and on the second angle.

Figure 14:
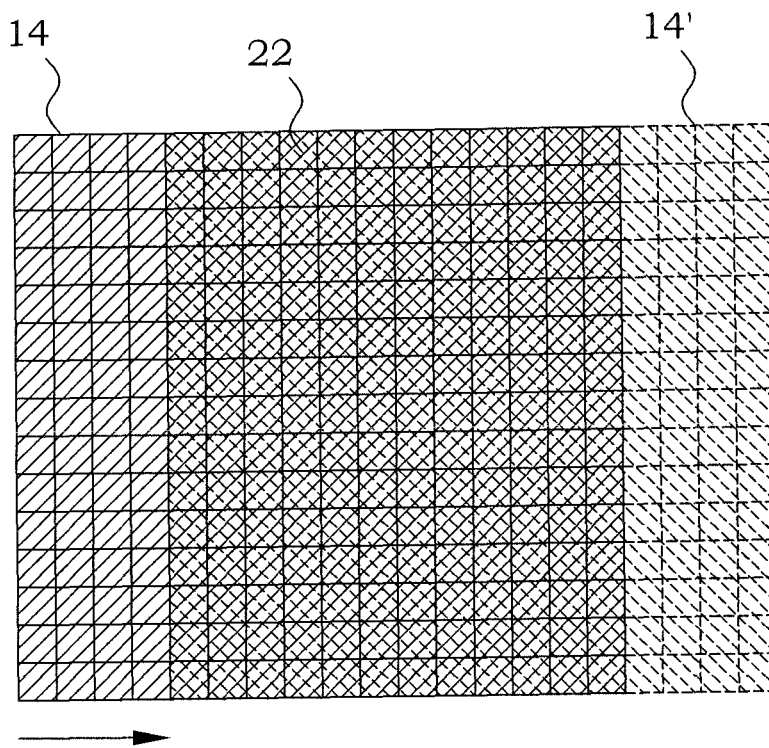
FIG. 14 illustrates schematically an embodiment of a multiple-exposure principle.

In some pattern generators, multiple exposures may be utilized. One way to arrange for multiple exposures of the target surface is to move the image area of the SLM at the target surface less than a full width of the image area between two exposures. A typical arrangement is to let the movement between two exposures correspond to an integer fraction of the image area width. As an example, if the image area is moved ¼ of the image area width between each exposure, each spot at the target surface will be exposed 4 times. This is schematically illustrated in FIG. 14. The array of imaged elements, i.e. the imaged area 14, is in this example 16 imaged elements 22 wide. Between each exposure, the imaged area 14 is moved a distance corresponding to 4 imaged elements, as indicated by the dotted line illustrating a next imaged area 14'. 12 rows of imaged elements will expose spots of the target surface that already has become exposed, while 4 rows of imaged elements will expose new parts of the target surface.

As anyone skilled in the art understands, the multiple exposure approach can be performed by any integer fraction of the image area. However, it is easier to control the total writing process if the width of the imaged area comprises a number of imaged elements that makes this integer fraction covering an integer number of imaged elements. In other words, it is preferred if the number of imaged elements in the movement direction is an integer times the number of multiple exposures.

In a system designed according to the main ideas presented here above, the number of imaged elements in the imaged area may depend on the raster scaling factor and the subsequent cropping of the SLM area in the direction of the movement of the imaged area. The resulting number of used imaged elements in the movement direction may therefore differ from one pattern to another. However, since the scaling factor in principle is free to select, at least within certain limits, the scaling factor may be selected in such a way that the preferred multiple exposure conditions are met.

If for example a six-time overlapping exposure is to be used, the total imaged area produced by the SLM has to comprise a number of imaged elements in the movement direction that is dividable by six. Assume furthermore that the full SLM width comprises 50 imaged elements. If at the same time, the period pattern has a periodicity corresponding to 6.7 times the pitch of the imaged elements, a natural choice for the scaling, when neglecting the multi-exposure limitation, would be to scale up the periodic pattern to 7 times the pitch of the imaged elements and crop the width of the imaged area to 7 repetitions of the pattern, i.e. 49 imaged elements. However, 49 is not dividable by 6 and multi-exposure will be difficult to perform. If instead a scaling-down of the period pattern to 6 times the pitch of the imaged elements, a cropping to 8 repetitions of the pattern into 48 imaged elements can be performed, which then also is compatible with multiple-exposure approaches.

In other words, in one embodiment, the rasterization method comprises the further step of obtaining data concerning a first number of partly overlapping exposures with an equidistant displacement in the first direction of the intended pattern generator. The first raster scaling factor in the step of scaling and the first integer number of repetitions in the step of cropping is selected so that the first integer number of repetitions times a ratio between the first integer and the first number of partly overlapping exposures becomes an integer. Preferably, the first raster scaling factor is selected to be as close to 1 as possible, taking constraints in selection of the first integer and the first integer number of repetitions, if any, into account.

In an even more elaborate version of multi-exposure, multi-exposure may be performed both in the first and second directions. The same arguing as above can then be applied also to the second direction.

In other words, in a further embodiment, the rasterization method comprises the further step of obtaining data concerning a second number of partly overlapping exposures with an equidistant displacement in the second direction of the intended pattern generator. The second raster scaling factor in the step of scaling and the second integer number of repetitions in the step of cropping is then selected so that the second number of repetitions times a ratio between the second integer and the second number of partly overlapping exposures becomes an integer. Preferably, the second raster scaling factor is selected to be as close to 1 as possible, taking constraints in selection of the second integer and the second integer number of repetitions, if any, into account.

The present ideas are applicable to all kinds of writing methods, however, the original targeted technical area was application to a lithography system or a photomask lithography system. Therefore, in a preferred embodiment, the pattern generator is a lithography system or a photomask lithography system.

Figure 15:
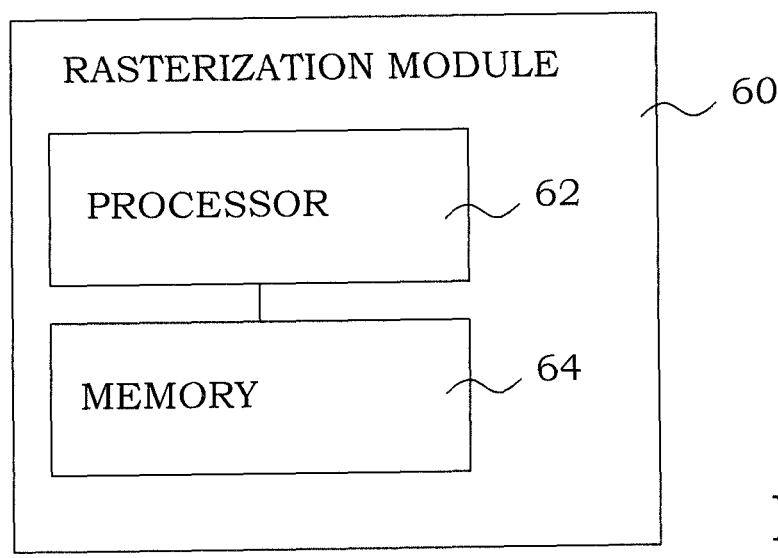
FIG. 15 illustrates schematically an embodiment of a rasterization module.

In FIG. 15, an embodiment of a rasterization module 60 for pattern generators being based on SLMs is illustrated. As explained above, the SLM has an array of individually controllable elements arranged for generating an array of imaged elements within an image area on a target surface, where illumination of each individual imaged element is controlled by a respective element. The rasterization module comprises a processor 62 and a memory 64. The memory 64 comprises instructions executable by the processor 62. Thereby, the rasterization module is configured to obtain an original pattern, having pattern items presenting a periodicity, to determine a first pattern main period in a first direction of the original pattern and to obtain information about the image area and a first pitch of imaged elements in the first direction of an intended pattern generator to be used. The instructions further enable the processor 62 to scale the original pattern in the first direction by a first raster scaling factor, giving a scaled pattern. The first raster scaling factor is equal to a first integer times the first pitch of the pattern generator in the first direction divided by the first pattern main period. The instructions further enable the processor 62 to crop the scaled pattern to comprise a first integer number of repetitions of the pattern items presenting a periodicity in the first direction, and including overlap tapering margins, if any, that is covered by the image area in the first direction of the intended pattern generator, giving a rasterized pattern adapted to the intended pattern generator. The rasterized pattern is associated with data representing the first raster scaling factor.

In a preferred embodiment, the memory 64 comprises further instructions executable by the processor 62, whereby the rasterization module is further configured to determine a second pattern main period in a second direction of the original pattern, the second direction is orthogonal in relation to the first direction. The instructions further enable the processor 62 to obtain information about the image area and a second pitch of imaged elements in the second direction of the intended pattern generator to be used, and to scale the original pattern in the second direction by a second raster scaling factor, giving the scaled pattern. The second raster scaling factor is equal to a second integer times the second pitch of the pattern generator in the second direction divided by the second pattern main period. The instructions further enable the processor 62 to crop the scaled pattern to comprise a second integer number of repetitions of the pattern items presenting a periodicity in the second direction, and including overlap tapering margins, if any, that is covered by the image area in the second direction of the intended pattern generation, giving the rasterized pattern adapted to the intended pattern generator. The rasterized pattern is further associated with data representing the second raster scaling factor.

Figure 16:
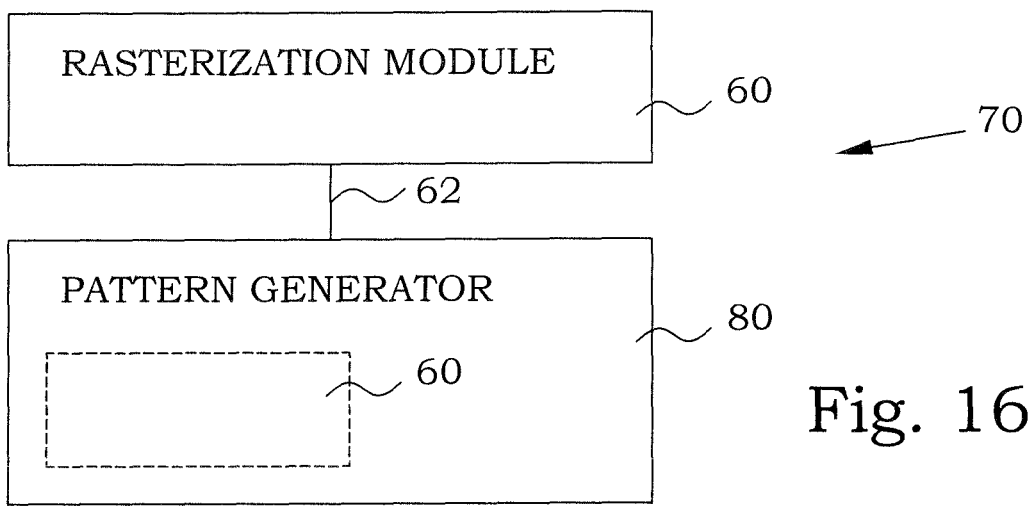
FIG. 16 illustrates schematically an embodiment of a pattern generation system.

FIG. 16 illustrates an embodiment of a pattern generation system 70, comprising a rasterization module 60 and a pattern generator 80. In this embodiment, the rasterization module 60 provides data representing a rasterized pattern with associated data representing scaling factor factors. In the present embodiment, the rasterization module 60 is illustrated as a separate unit. The rasterized pattern can then be transferred to the pattern generator 80 by a communication connection 62 or by wireless alternatives. Alternatively, the data representing a rasterized pattern can be provided by the rasterization module 60 in a data storage unit that is physically brought to the pattern generator 80 for access.

However, the rasterization module 60 may in other embodiments be provided as a part of the pattern generator 80, as illustrated by the dotted lines, where the processing capabilities preferably are shared by the pattern generator 80 and the rasterization module 60. The transfer of the rasterized pattern from the rasterization module 60 to the pattern generator 80 is then performed by internal means.

Figure 17:
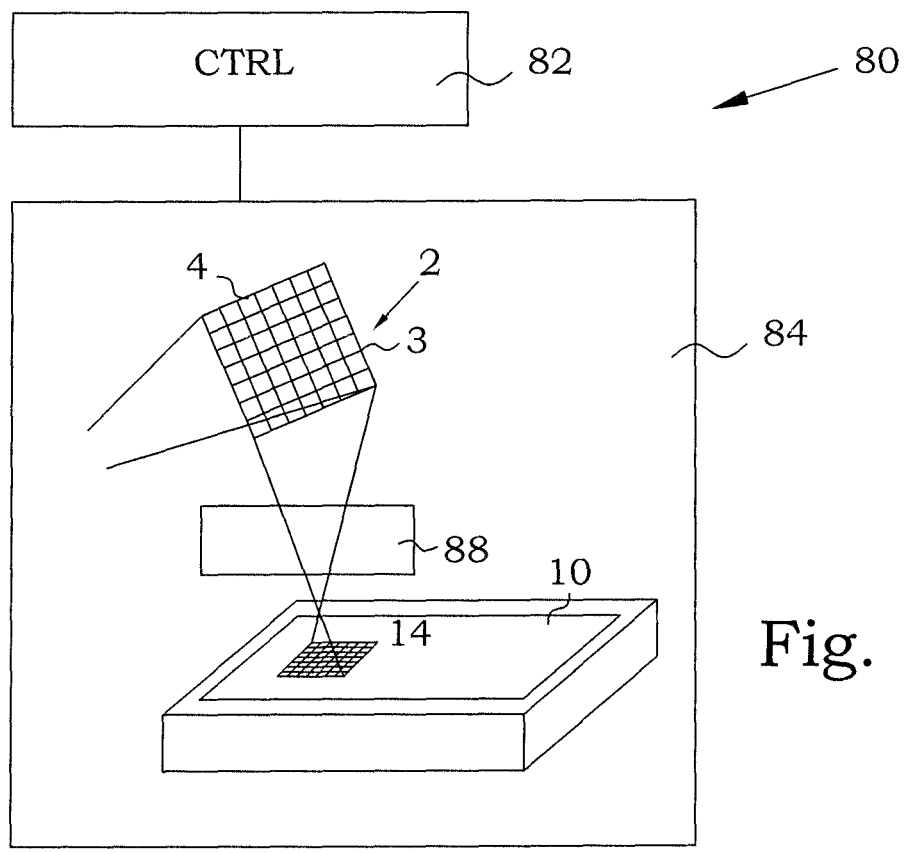
FIG. 17 illustrates schematically an embodiment of a pattern generator.

FIG. 17 illustrates schematically an embodiment of a pattern generator 80. The pattern generator 80 comprises a control module 82 and an imaging module 84. The imaging module 84 is arranged for writing a pattern to an image area. The imaging module comprises an SLM 2. The SLM 2 has an array 3 of individually controllable elements 4 arranged for generating an array of imaged elements within an image area on a target surface 10. The illumination of each individual imaged element is controlled by a respective element 4, based on instructions from the control module 84.

The control module 82 is configured for obtaining a rasterized pattern with associated data representing a first raster scaling factor, defining scaling in a first direction of the rasterized pattern. As described above, this rasterized pattern can be provided in different ways, from an internal or external source.

The control module 82 is further configured for setting elements 4 of the SLM 2 in the pattern generator arrangement falling outside the rasterized pattern in the first direction to be disabled.

The imaging module 84 comprising optical means 88, controlled by the control module 82, for scaling the rasterized pattern with a first optical scaling factor in the first direction before being written to the image area. The first optical scaling factor is non-unity.

In one embodiment, the first optical scaling factor is equal to the inverse of the first raster scaling factor.

In one embodiment, the control module 84 is further configured for obtaining the rasterized pattern with further associated data representing a second raster scaling factor, defining scaling in a second direction of the rasterized pattern. The second direction is orthogonal in relation to the first direction.

The control module 82 is further configured for also setting elements 4 of the SLM 2 in the pattern generator arrangement 80 falling outside the rasterized pattern in the second direction to be disabled.

The imaging module comprises optical means 88, controlled by the control module 82, for further scaling the rasterized pattern with a second optical scaling factor in the second direction before being written to the image area.

In one embodiment, both the first optical scaling factor and the second optical scaling factor are non-unity.

In one embodiment, the second optical scaling factor is equal to the inverse of the second raster scaling factor.

Figure 18:
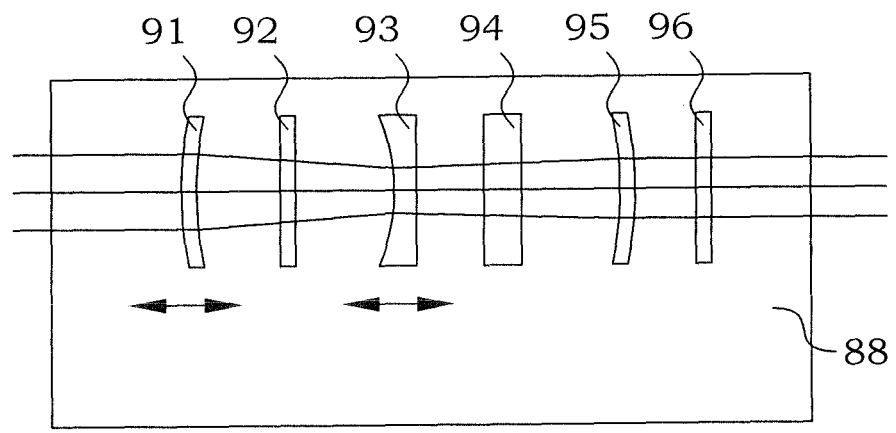
FIG. 18 illustrates schematically an embodiment of an optical means for optical scaling in two directions.
Figure 18:
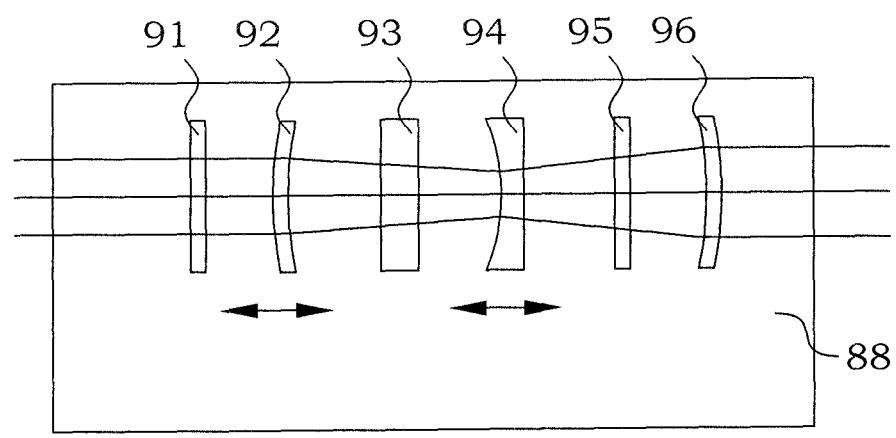

FIG. 18 illustrates one embodiment of an optical means 88 for scaling an exposure beam representing a rasterized pattern. The rasterized pattern is scaled with a first optical scaling factor in a first direction before being written to the image area and optionally with a second optical scaling factor in a second direction.

In the upper part, of the figure, a schematic view in the second direction is illustrated. Six lens elements 91-96 are provided, of which lens elements 91, 93 and 95 are responsible for the optical scaling in the first direction. The lens elements 91, 93 and 95 are cylindrical lenses with a curvature center along an axis perpendicular to the illustrated view. Lens elements 91 and 93 are movable along the optical axis in order to provide different optical scaling. Lens element 95 is fixed.

In the lower part, of the figure, a schematic view in the first direction is illustrated. Six lens elements 91-96 are provided, of which lens elements 92, 94 and 96 are responsible for the optical scaling in the second direction. The lens elements 92, 94 and 96 are cylindrical lenses with a curvature center along an axis perpendicular to the illustrated view. Lens elements 92 and 94 are movable along the optical axis in order to provide different optical scaling. Lens element 96 is fixed.

The embodiment of the optical means 88 above is only an example of how to obtain the optical scaling that may be different and adjustable in different directions. Anyone skilled in the art realizes that similar arrangements having different numbers and types of lenses can be used as well as other optical arrangements allowing the scaling to be adapted differently in different directions.

The SLM 2 can in different embodiment comprise Digital Micromirror Devices, Liquid Crystal Displays, Grating Light Valves, Planar Light Valves, Micro Shutter Arrays, Analogue Spatial Light Modulators and/or Liquid Crystal on Silicon.

In one embodiment, the pattern generator is a lithography system or a photomask lithography system.

In one embodiment, the pattern generator 80 comprises more than one SLM 2. The control module 84 is thereby configured for controlling each SLM 2 separately according to obtained rasterized patterns.

The embodiments described above are to be understood as a few illustrative examples of the present invention. It will be understood by those skilled in the art that various modifications, combinations and changes may be made to the embodiments without departing from the scope of the present invention. In particular, different part solutions in the different embodiments can be combined in other configurations, where technically possible. The scope of the present invention is, however, defined by the appended claims.

The invention claimed is:

1. A rasterization method of patterns with periodic components for pattern generators being based on spatial light modulators, said spatial light modulators each having an array of individually controllable elements arranged for generating an array of imaged elements within an image area on a target surface, where illumination of each individual imaged element is controlled by a respective said element, said rasterization method comprising the steps of:
   obtaining an original pattern, having pattern items presenting a periodicity;
   determining a first pattern main period in a first direction of said original pattern;
   obtaining information about said image area and a first pitch of imaged elements in said first direction of an intended pattern generator to be used;
   scaling said original pattern in said first direction by a first raster scaling factor, giving a scaled pattern;
   said first raster scaling factor being equal to a first integer times said first pitch of said intended pattern generator in said first direction divided by said first pattern main period;
   cropping said scaled pattern to comprise a first integer number of repetitions of said pattern items presenting a periodicity in said first direction, and including overlap tapering margins, if any, being covered by said image area in said first direction of said intended pattern generator, giving a rasterized pattern adapted to said intended pattern generator;
   said rasterized pattern being associated with data representing said first raster scaling factor.

2. The rasterization method according to claim 1, wherein a first main axis of said array of imaged elements is rotated with a first angle in relation to said first direction, whereby said first pitch is dependent on a distance between two consecutive said imaged elements along said first main axis and on said first angle.

3. The rasterization method according to claim 2, comprising the further steps of:
   determining a second pattern main period in a second direction of said original pattern, said second direction being orthogonal in relation to said first direction;
   obtaining information about said image area and a second pitch of imaged elements in said second direction of said intended pattern generator to be used;
   whereby said step of scaling said original pattern further comprises scaling of said original pattern also in said second direction by a second raster scaling factor, giving said scaled pattern;
   said second raster scaling factor being equal to a second integer times said second pitch of said intended pattern generator in said second direction divided by said second pattern main period;
   whereby said step of cropping further comprises cropping of said scaled pattern also to comprise a second integer number of repetitions of said pattern items presenting a periodicity in said second direction, and including overlap tapering margins, if any, being covered by said image area in said second direction of said intended pattern generator, giving said rasterized pattern;
   whereby said rasterized pattern being further associated with data representing said second raster scaling factor.

4. The rasterization method according to claim 2, comrpising a further step of obtaining data concerning a first number of partly overlapping exposures with an equidistant displacement in said first direction of said intended pattern generator, whereby said first raster scaling factor in the step of scaling and said first integer number of repetitions in said step of cropping is selected so that said first integer number of repetitions times a ratio between said first integer and said first number of partly overlapping exposures becomes an integer.

5. The rasterization method according to claim 1, comprising the further steps of:
   determining a second pattern main period in a second direction of said original pattern, said second direction being orthogonal in relation to said first direction;
   obtaining information about said image area and a second pitch of imaged elements in said second direction of said intended pattern generator to be used;
   whereby said step of scaling said original pattern further comprises scaling of said original pattern also in said second direction by a second raster scaling factor, giving said scaled pattern;
   said second raster scaling factor being equal to a second integer times said second pitch of said intended pattern generator in said second direction divided by said second pattern main period;
   whereby said step of cropping further comprises cropping of said scaled pattern also to comprise a second integer number of repetitions of said pattern items presenting a periodicity in said second direction, and including overlap tapering margins, if any, being covered by said image area in said second direction of said intended pattern generator, giving said rasterized pattern;
   whereby said rasterized pattern being further associated with data representing said second raster scaling factor.

6. The rasterization method according to claim 5, wherein a second main axis of said array of imaged elements is rotated with a second angle in relation to said second direction, whereby said second pitch is dependent on a distance between two consecutive said imaged elements along said second main axis and on said second angle.

7. The rasterization method according to claim 5, comprising a further step of obtaining data concerning a second number of partly overlapping exposures with an equidistant displacement in said second direction of said intended pattern generator, whereby said second raster scaling factor in the step of scaling and said second integer number of repetitions in said step of cropping is selected so that said second number of repetitions times a ratio between said second integer and said second number of partly overlapping exposures becomes an integer.

8. The rasterization method according to claim 7, wherein at least one of:
   said first raster scaling factor is selected to be as close to 1 as possible, taking constraints in selection of said first integer and said first integer number of repetitions, if any, into account, and
   said second raster scaling factor is selected to be as close to 1 as possible, taking constraints in selection of said second integer and said second integer number of repetitions, if any, into account.

9. The rasterization method according to claim 5, comprising a further step of obtaining data concerning a first number of partly overlapping exposures with an equidistant displacement in said first direction of said intended pattern generator, whereby said first raster scaling factor in the step of scaling and said first integer number of repetitions in said step of cropping is selected so that said first integer number of repetitions times a ratio between said first integer and said first number of partly overlapping exposures becomes an integer.

10. The rasterization method according to claim 1, comprising a further step of obtaining data concerning a first number of partly overlapping exposures with an equidistant displacement in said first direction of said intended pattern generator, whereby said first raster scaling factor in the step of scaling and said first integer number of repetitions in said step of cropping is selected so that said first integer number of repetitions times a ratio between said first integer and said first number of partly overlapping exposures becomes an integer.

11. A writing method of patterns with periodic components for pattern generators being based on spatial light modulators, said spatial light modulators each having an array of individually controllable elements arranged for generating an array of imaged elements within an image area on a target surface, where illumination of each individual imaged element is controlled by a respective said element, said writing method comprising the steps of:
    obtaining a rasterized pattern with associated data representing a first raster scaling factor, defining scaling in a first direction of said rasterized pattern;
    setting elements of said spatial light modulators in said pattern generators falling outside said rasterized pattern in said first direction to disabled;
    writing said rasterized pattern to said image area on said target surface;
    said writing comprising scaling with a first optical scaling factor in said first direction;
    whereby said first optical scaling factor is non-unity.

12. The writing method according to claim 11, wherein said first optical scaling factor is equal to an inverse of said first raster scaling factor.

13. The writing method according to claim 12, wherein
    said rasterized pattern is further associated with data representing a second raster scaling factor, defining scaling in a second direction of said rasterized pattern, said second direction being orthogonal in relation to said first direction;
    wherein said step of setting elements of said spatial light modulators to disabled further comprises setting elements of said spatial light modulators in said pattern generators falling outside said rasterized pattern in said second direction to disabled;
    whereby said writing further comprising scaling with a second optical scaling factor in said second direction.

14. The writing method according to claim 11, wherein
    said rasterized pattern is further associated with data representing a second raster scaling factor, defining scaling in a second direction of said rasterized pattern, said second direction being orthogonal in relation to said first direction;
    wherein said step of setting elements of said spatial light modulators to disabled further comprises setting elements of said spatial light modulators in said pattern generators falling outside said rasterized pattern in said second direction to disabled;
    whereby said writing further comprising scaling with a second optical scaling factor in said second direction.

15. The writing method according to claim 14, wherein both said first optical scaling factor and said second optical scaling factor are non-unity to reach said image area.

16. The writing method according to claim 14, wherein said second optical scaling factor is equal to an inverse of said second raster scaling factor.

17. A rasterization module for pattern generators being based on spatial light modulators, said spatial light modulators each having an array of individually controllable elements arranged for generating an array of imaged elements within an image area on a target surface, where illumination of each individual imaged element is controlled by a respective said element, said rasterization module comprising:
    a processor; and
    a memory;
    said memory comprising instructions executable by the processor, whereby said rasterization module is configured to:
        obtain an original pattern, having pattern items presenting a periodicity;
        determine a first pattern main period in a first direction of said original pattern;
        obtain information about said image area and a first pitch of imaged elements in said first direction of an intended pattern generator to be used;
        scale said original pattern in said first direction by a first raster scaling factor, giving a scaled pattern;
        said first raster scaling factor being equal to a first integer times said first pitch of said intended pattern generator in said first direction divided by said first pattern main period;
        crop said scaled pattern to comprise a first integer number of repetitions of said pattern items presenting a periodicity in said first direction, and including overlap tapering margins, if any, being covered by said image area in said first direction of said intended pattern generator, giving a rasterized pattern adapted to said intended pattern generator;
        said rasterized pattern being associated with data representing said first raster scaling factor.

18. The rasterization module according to claim 17, wherein
    said memory comprising further instructions executable by the processor, whereby said rasterization module is further configured to:
        determine a second pattern main period in a second direction of said original pattern, said second direction being orthogonal in relation to said first direction;
        obtain information about said image area and a second pitch of imaged elements in said second direction of said intended pattern generator to be used;
        scale said original pattern in said second direction by a second raster scaling factor, giving said scaled pattern;
        said second raster scaling factor being equal to a second integer times said second pitch of said intended pattern generator in said second direction divided by said second pattern main period;
        crop said scaled pattern to comprise a second integer number of repetitions of said pattern items presenting a periodicity in said second direction, and including overlap tapering margins, if any, being covered by said image area in said second direction of said intended pattern generator, giving said rasterized pattern adapted to said intended pattern generator;
        said rasterized pattern being further associated with data representing said second raster scaling factor.

19. A pattern generator, comprising:

a control module; and an imaging module arranged for writing a pattern to an image area by means of spatial light modulators, said spatial light modulators each having an array of individually controllable elements arranged for generating an array of imaged elements within said image area on a target surface, where illumination of each individual imaged element is controlled by a respective said element;

said control module being configured for obtaining a rasterized pattern with associated data representing a first raster scaling factor, defining scaling in a first direction of said rasterized pattern;

said control module being further configured for setting elements of said spatial light modulators in said imaging module falling outside said rasterized pattern in said first direction to disabled;

said imaging module comprising optical means, controlled by said control module, for scaling said rasterized pattern with a first optical scaling factor in said first direction before being written to said image area; whereby said first optical scaling factor is non-unity.

20. The pattern generator according to claim 19, wherein said control module being further configured for obtaining said rasterized pattern with further associated data representing a second raster scaling factor, defining scaling in a second direction of said rasterized pattern, said second direction being orthogonal in relation to said first direction;

said control module being further configured for setting also elements of said spatial light modulators in said imaging module falling outside said rasterized pattern in said second direction to disabled;

said imaging module comprising optical means, controlled by said control module, for further scaling said rasterized pattern with a second optical scaling factor in said second direction before being written to said image area.

* * * * *